US006668076B2

(12) United States Patent
Penkethman

(10) Patent No.: US 6,668,076 B2
(45) Date of Patent: Dec. 23, 2003

(54) APPARATUS AND METHOD FOR PROJECTING AN ALIGNMENT IMAGE

(75) Inventor: John A. Penkethman, Gilroy, CA (US)

(73) Assignee: Electroglas, Inc., San Jose, CA (US)

( * ) Notice: Subject to any disclaimer, the term of this patent is extended or adjusted under 35 U.S.C. 154(b) by 0 days.

(21) Appl. No.: 10/379,786

(22) Filed: Mar. 4, 2003

(65) Prior Publication Data
US 2003/0142861 A1 Jul. 31, 2003

Related U.S. Application Data

(63) Continuation of application No. 09/262,947, filed on Mar. 4, 1999, now Pat. No. 6,549,649.

(51) Int. Cl.$^7$ .................................................. G06K 9/00
(52) U.S. Cl. ........................ 382/151; 348/87; 348/189; 250/49.1; 250/559.1; 324/758
(58) Field of Search ................................. 382/144, 145, 382/146, 147, 148, 149, 151, 152; 348/125, 126, 129, 130, 131, 189, 190, 191, 87, 94, 95; 324/758, 754, 756; 250/252.1, 491.1, 559.1, 559.34, 559.01, 559, 208.1

(56) References Cited

U.S. PATENT DOCUMENTS

| 4,742,376 A | * | 5/1988 | Phillips | ....................... 355/43 |
| 4,967,088 A | * | 10/1990 | Stengl et al. | ............ 250/491.1 |
| 5,657,394 A | * | 8/1997 | Schwartz et al. | ........... 382/152 |
| 5,694,482 A | * | 12/1997 | Maali et al. | ................. 382/151 |
| 6,096,567 A | * | 8/2000 | Kaplan et al. | ................. 324/34 |
| 6,118,894 A | * | 9/2000 | Schwartz et al. | ........... 382/151 |
| 6,181,474 B1 | * | 1/2001 | Ouderkirk et al. | ........ 250/252.1 |

* cited by examiner

Primary Examiner—Jayanti K. Patel
Assistant Examiner—Sheela Chawan
(74) Attorney, Agent, or Firm—Blakely, Sokoloff, Taylor & Zafman LLP

(57) ABSTRACT

A testing system operable to accurately position a plurality of contact electrodes relative to a plurality of electrical contacts is disclosed. For one embodiment, the testing system comprises a first imaging system coupled to a wafer chuck. The wafer chuck is used to place the electrical contacts of a wafer in contact with the plurality of electrodes. To facilitate accurate positioning between the wafer electrical contacts and the contact electrodes, the first imaging system is configured to locate the plurality of contact electrodes. The testing system also comprises a second imaging system configured to locate the wafer electrical contacts. An image generator coupled to the first imaging system generate an alignment image on a focal point of the first imaging system. The testing system calibrates the first imaging system to the second imaging system using the alignment image.

32 Claims, 5 Drawing Sheets

APPARATUS AND METHOD FOR PROJECTING AN ALIGNMENT IMAGE

This is a continuation of application Ser. No. 09/262,947, filed Mar. 4, 1999, now U.S. Pat. No. 6,549,649.

FIELD OF THE INVENTION

The present invention relates to an apparatus and method for projecting an alignment image. More particularly, the present invention relates to an apparatus and method that generates a projected reticle image to facilitate the calibration between a moveable direct probe sensor camera and a fixed camera.

BACKGROUND OF THE INVENTION

Improvements in manufacturing processes has led to an increase in the density and complexity of semiconductor devices placed on a single silicon wafer. The increased density of semiconductor devices, however, has reduced the accuracy of wafer sorts. Wafer sort, or wafer probe, describes the process of using probe cards to identify semiconductor devices at the wafer stage of manufacture that have inter-connectivity or electrical malfunctions prior to the individual packaging of the semiconductor devices. In particular, a probe card includes a collection of electrical contacts, pins, or probes that are positioned to make contact with the bonding pads of the semiconductor device under test ("DUT"). Subsequently, Automatic Test Equipment ("ATE") electrically connected to the probe cards, generates electrical tests to examine the inter-connectivity or electrical operation of the DUT.

As the density of semiconductor devices increase, the dimensions of the probe card have dramatically shrunk to ensure proper probe-to-pad alignment. Probe-to-pad alignment describes accurately positioning the bonding pads of a semiconductor device located on a wafer in such a way that the bonding pads of the device make good electrical contact with the probe tips of the probe card. The modified probe card dimensions, however, create numerous problems during probe-to-pad alignment. To ensure accurate probe-to-pad alignment numerous methods have been developed in the prior art.

One method of a prior art probe-to-pad alignment uses a dummy wafer in conjunction with an auto-align fixed camera. The fixed camera is a downward looking camera with a fixed position and a known field of view. Using the fixed downward looking camera to view the bonding pads and other features on a wafer, the location of the bond pads on the DUT are determined in horizontal dimensions 'x' and 'y'. The 'z', or vertical location, of the wafer surface, or equivalently, of the bond pads, is determined using a separate system. Next, a dummy wafer with a soft markable surface, such as an aluminum layer, is probed. The probing causes the probe tips to leave indentations on the dummy wafer. Based on the location of the probe indentations the fixed camera determines the 'x-y' coordinates of the probe tips relative to the dummy wafer. Using the derived 'x-y' coordinates of the probe tips, the prober positions the bond pads of a DUT in contact with the probe tips. Thus, probe-to-pad alignment is achieved. The method of using dummy wafers for probe-to-pad alignment, however, has numerous drawbacks. In particular, this method results in wasted wafers, possible damage of probe tips, reliance on an alternate system to measure 'z' coordinates, and reliance on probe indentations to interpret actual probe tip position.

To counteract the reliance on dummy wafers, prior art probers developed a direct probe sensor ("DPS") camera. In the prior art, the DPS camera is used in conjunction with the fixed camera to align probe tips and bond pads. In particular, the DPS camera is an upward looking camera that records the x, y, and z coordinates of the probe tips of a probe card. As previously described, the fixed camera is a down ward looking camera that determines the x, y, and z coordinates of the bond pads of a DUT located on a wafer. Based on the x, y, and z coordinates of the probe tips and the bond pads, the prober positions the wafer to align the probe tips of the probe card with the bond pads of the DUT.

FIG. 1 illustrates a prior art prober using a DPS camera. In particular, system 100 includes a probe card 160 with probe tips 165. System 100 also includes lens system 120, physical reticle 140, and DPS 110—a charge coupled device ("CCD") that records images on pixel grid 115. System 100 records the location of probe tips 165 via lens system 120. System 100 also includes wafer chuck 170. Wafer chuck 170 is coupled to lens system 120. System 100 moves wafer chuck 170 in the x, y, and z coordinates to place a wafer (not shown) in contact with probe tips 165. System 100 also moves wafer chuck 170 in the x, y, and z coordinates to record the location of probe tips 165.

Prior to recording the probe tip locations, the x, y, and z coordinates of the field of view of DPS 110 is calibrated with a fixed camera (not shown). As previously described, the fixed camera is a downward looking camera with a fixed position and a known field of view. The calibration between DPS 110 and the fixed camera is performed via physical reticle 140. In the prior art, physical reticle 140 is a thin plate of glass with cross-hair pattern 150 located in the center of the glass plate. During calibration, physical reticle 140 is placed at the focal point of DPS 110—denoted as focal 180. Using the image generated by cross-hair pattern 150, DPS 110 generates a pixel representation of cross-hair pattern 150 on pixel grid 115. The pixel representation is relayed to a prober (not shown). Subsequently, housing 170 moves physical reticle 140 under the fixed camera and the fixed camera's field of vision relative to cross-hair pattern 150 is determined and relayed to the prober.

The prober correlates the pixel representation of cross-hair pattern 150 generated by DPS 110 to the known location and field of view of the fixed camera. Thus, the position of a probe tip viewed by DPS 110 is accurately determined because both cameras, DPS 110 and the fixed camera, are calibrated to each other by focusing on the same intermediate target—cross-hair 150. Using physical reticle 140 for alignment between DPS 110 and the fixed camera, however, create numerous disadvantages.

One disadvantage of using a physical reticle results from the design characteristics of the physical reticle. In particular, as previously described, physical reticle 140 is designed using a glass plate. The glass pate, however, creates an image offset because there is an optical path difference between glass and the air surrounding physical reticle 140. The image offset results in a shifted cross-hair 150, which in turn results in a calibration offset in the "z" direction.

Another disadvantage of using a physical reticle results from the requirement of operator intervention of the physical reticle. In particular, physical reticle 140 is removed during non-calibration (i.e. normal testing) use. Thus, full automation is prevented.

Yet another disadvantage of using a physical reticle results from the close proximity of the physical reticle to the probe tips. In particular, during the calibration of DPS 110, the physical reticle 110 may cause damage to the probe tips through accidental contact.

SUMMARY OF THE INVENTION

A testing system operable to accurately position a plurality of contact electrodes relative to a plurality of electrical contacts is disclosed. For one embodiment, the testing system comprises a first imaging system coupled to a wafer chuck. The wafer chuck is used to place the electrical contacts of a wafer in contact with the plurality of electrodes. To facilitate accurate positioning between the wafer electrical contacts and the contact electrodes, the first imaging system is configured to locate the plurality of contact electrodes. The testing system also comprises a second imaging system configured to locate the wafer electrical contacts. To calibrate the objects viewed by the first imaging system and the second imaging system, an image generator coupled to at least one of the imaging systems generates an alignment image along the optical path of the imaging system. The testing system calibrates positioning and imaging information between the first imaging system and the second imaging system using the alignment image.

According to another embodiment, an imaging system operable to generate an alignment image is disclosed. The imaging system comprises an image generator configured to generate the alignment image. The imaging system also comprises an objective coupled to the image generator that has an optical path including an objective lens, a rear image forming lens, and a beam-splitter coupled between the objective lens and the rear image forming lens. The beam-splitter is configured to inject the alignment image into the optical path of the imaging system. For one embodiment, the imaging system generates the alignment image on the focal point of the imaging system via a charge coupled device. Specifically, a reflective charge coupled device is coupled to the objective. The reflective charge coupled device is configured to reflect the alignment image onto the focal point of the imaging system.

For yet another embodiment, the alignment image projected on the charge coupled device and the reflected alignment image are optically conjugate points. Thus, a second imaging system viewing the projected alignment image of a first imaging system results in both imaging system viewing the identical image at the same point in space.

Other features and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which.

DETAILED DESCRIPTION

An automatic test equipment that generates an image to calibrate a direct probe sensor camera and a wafer sort camera is disclosed. For one embodiment, the image is generated within the direct probe sensor ("DPS") camera. The generated image is located at the focal point of the DPS camera. In the present embodiment, both the DPS camera and the wafer sort camera include a charge coupled device ("CCD") to record viewed objects. Accordingly, the generated image is located at both the focal point of the DPS camera and on the CCD of the DPS camera. During calibration, the DPS camera records the pixel location of the image on the CCD of the DPS. Alternatively, during calibration, the DPS camera records the pixel location of the image on the CCD of the DPS. The DPS camera transfers the pixel representation to a prober. Subsequently, the prober moves the image over to the wafer sort camera. The wafer sort camera focuses on the image and generates a pixel representation of the image. Alternatively, the wafer sort camera focuses on the image and records the pixel location of the image. The pixel image recorded by the wafer sort camera is also transferred to the prober. Accordingly, for each pixel, the prober correlates the pixel image recorded by DPS camera to the pixel image recorded by the wafer sort camera, thus calibrating the two camera system. The calibration allows the prober to position a first object viewed by the DPS camera relative to a second object viewed by the wafer sort camera.

For one embodiment, the prober uses the DPS camera to view probe pins of a probe card. The prober also uses the wafer sort camera to view bond pads. Accordingly, the calibration allows the prober to accurately place the probe pins in contact with the bond pads. For another embodiment, the wafer sort camera is replace by a wafer alignment camera.

For an alternative embodiment, the calibration between the DPS camera and the wafer sort camera is implemented without the generated image. Instead, the entire CCD of the DPS is illuminated. After the illumination of the DPS CCD, the prober moves the DPS camera below the wafer sort camera. Subsequently, the wafer sort camera records the position of the pixels of the CCD included in the DPS camera. The prober correlates the pixels recorded by the wafer sort camera to the actual pixels of the DPS camera, thus calibrating the two camera system.

Figure 1:
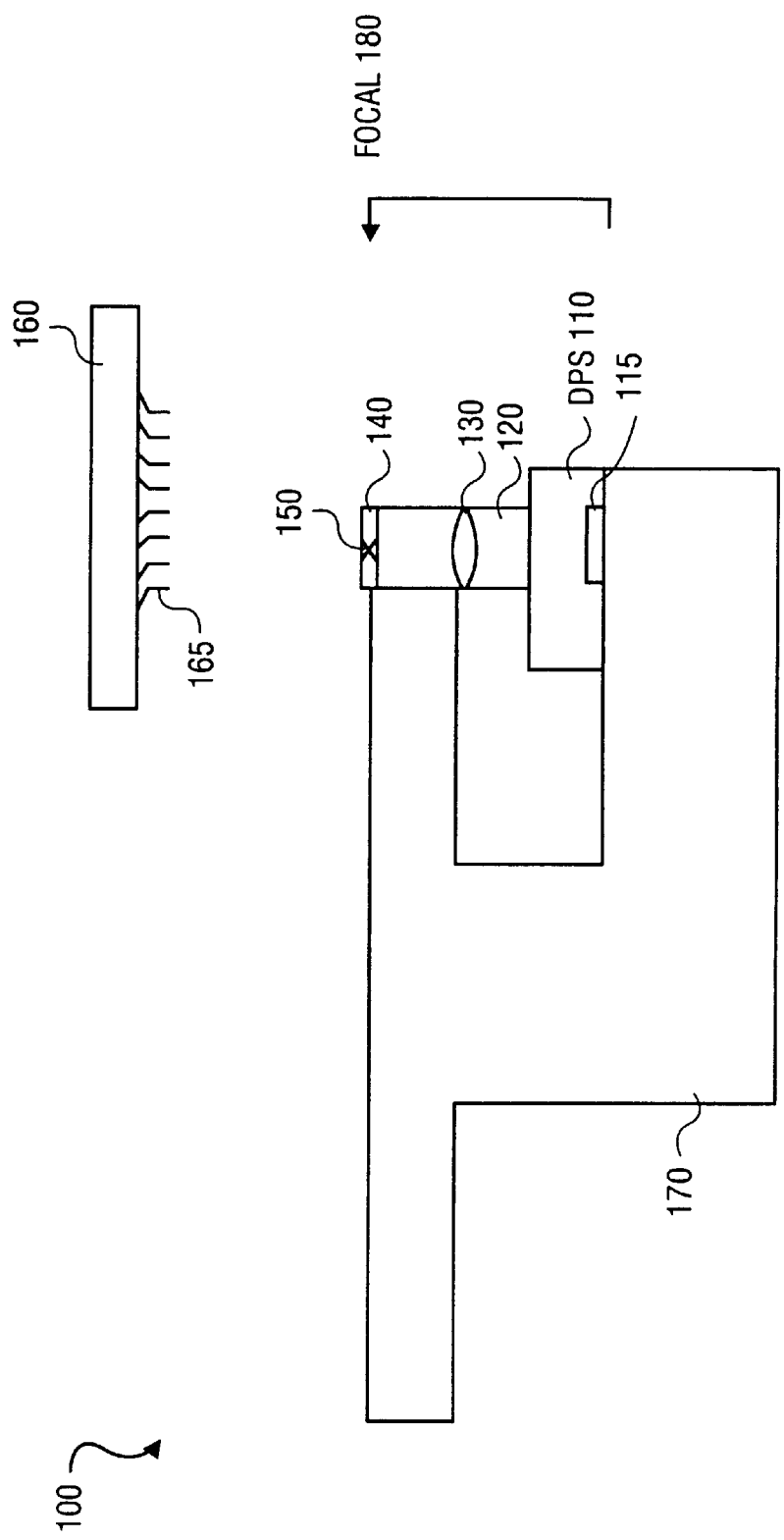
FIG. 1 illustrates a prior art direct probe sensor camera.
Figure 2:
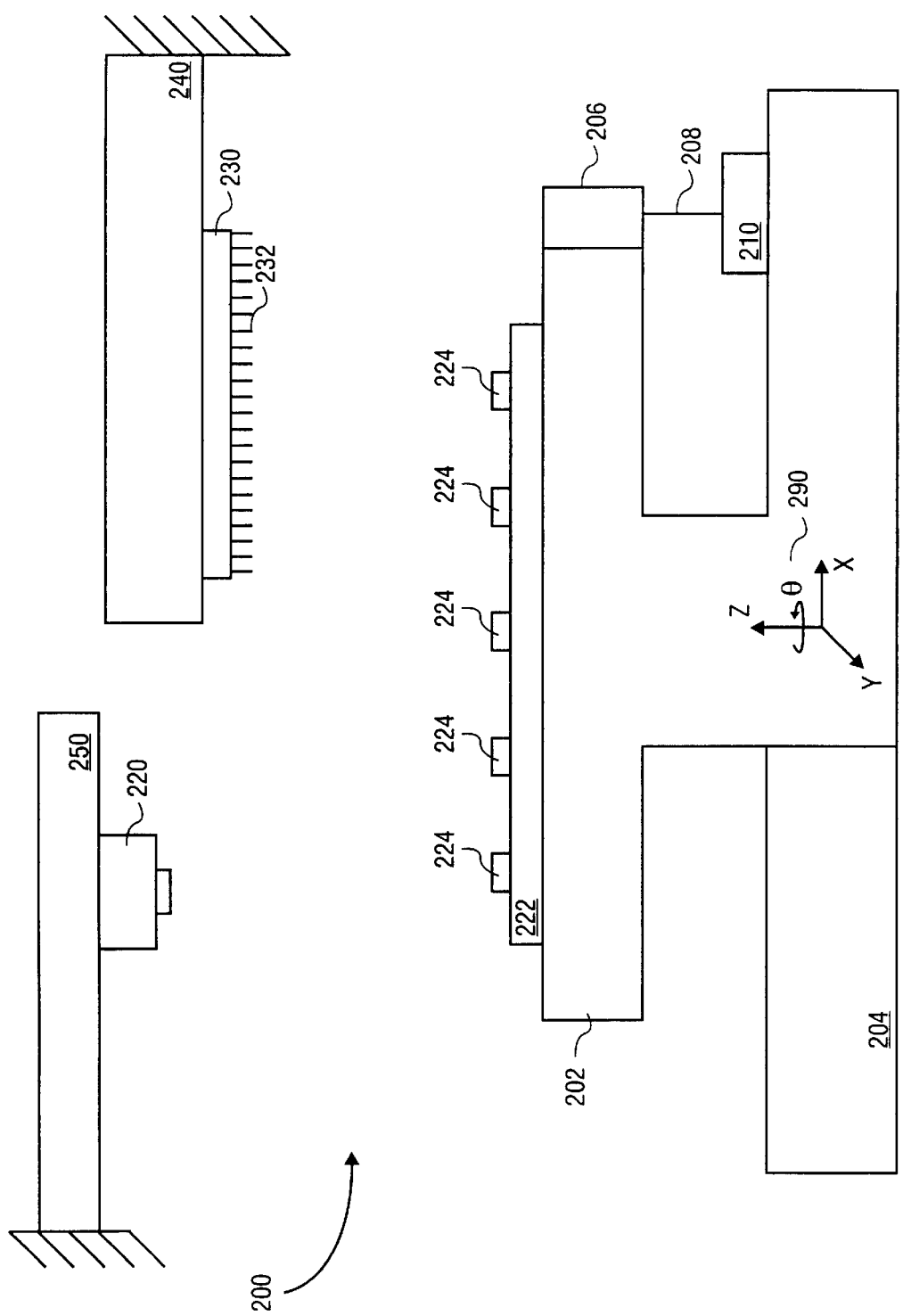
FIG. 2 illustrates one embodiment of an automatic test equipment.

FIG. 2 illustrates an embodiment of an automatic test equipment ("ATE") implemented by the present invention. In particular, system 200 comprises a wafer chuck (202) coupled to an orientation mechanism (204) in a manner which allows wafer chuck 202 to be moved in the X, Y, Z, and theta directions 290. Wafer chuck 202 accepts the attachment of a wafer (222). System 200 also includes a probe card holder (240) which accepts a probe card (230). For one embodiment, probe card 230 may be any of the different varieties of probe cards, including for example membrane probe cards. For an alternative embodiment, probe card holder 240 may be configured to provide movement of probe card 230 in any of the X, Y, Z, or theta directions 290. As illustrated in FIG. 2, probe card 230 includes a number of conducting contact electrodes. The contact electrodes may in one embodiment include metallic pins (232). Provided the probe card and the wafer are properly aligned by system 200, pins 232 make contact with pads 224 of wafer 222, thus allowing system 200 to test the inter-connectivity and electrical operation of devices located on wafer 222. For one embodiment, pads 224 comprise any contact electrode surface including, but not limited to, a flat surface, a solder bump, pins, or posts.

Pads 224 and pins 232 are placed in contact via direct probe sensor ("DPS") camera 206–210 and fixed camera 220, alternatively referred to as a wafer alignment camera. In particular, DPS camera 206–210, is configured to view pins 232 on probe card 230. Fixed camera 220 is coupled to a fixed reference point, base 250, and is configured to view pads 224 on wafer 222. For one embodiment, system 200 uses the location of pins 232 recorded by DPS camera 206–210 in conjunction with the current pad 224 location viewed by fixed camera 220 to incrementally move wafer chuck 202 until pads 224 come in contact with probe pins 232. For alternative embodiments, fixed camera 220, may contain both coaxial and oblique illumination sources. For another embodiment, probe card holder 240 is coupled to base 250. For yet another embodiment, system 200 includes a computer system (not shown) with a central processing unit and memory. Based on the DPS camera 206–210 and fixed camera 220 data, computer system applies control signals to orientation mechanism (204), thus moving wafer chuck 202 until pads 224 come in contact with probe pins 232. The computer system is also used to calibrate DPS camera 206–210 and fixed camera 220.

As illustrated in FIG. 2, DPS camera 206–210 and fixed camera 220 comprise two physically disjointed camera systems. Specifically, the camera systems do not share the same objective or lenses. Thus, calibration between the two camera systems is necessary to ensure the accurate positioning of wafer chuck 202 relative to pins 232.

For one embodiment, the calibration between the two systems is performed by an image generated by DPS camera 206–210. In particular, both DPS camera 206–210 and fixed camera 220 simultaneously focus on the generated image. Subsequently, system 200 correlates the image and positioning information determined by DPS camera 206–210 with the image and positioning information determined by fixed camera 220, thus calibrating the two cameras.

For an alternative embodiment, DPS camera 206–210 focuses on the generated image, hereinafter referred to as a calibration image or alternatively as an alignment image. Subsequently, orientation mechanism 204 moves the generated image below fixed camera 220 so that fixed camera 220 can focus on the generated image. Based on the movement of orientation mechanism 204 and the images record by both cameras, system 200 determines the relative position between the two camera's focal points. Thus, calibrating DPS camera 206–210 to fixed camera 220. For an alternative system, based on the movement of orientation mechanism 204 and the images recorded by both cameras, a computer system coupled to system 200 determines the relative position between the two camera's focal points.

Figure 3:
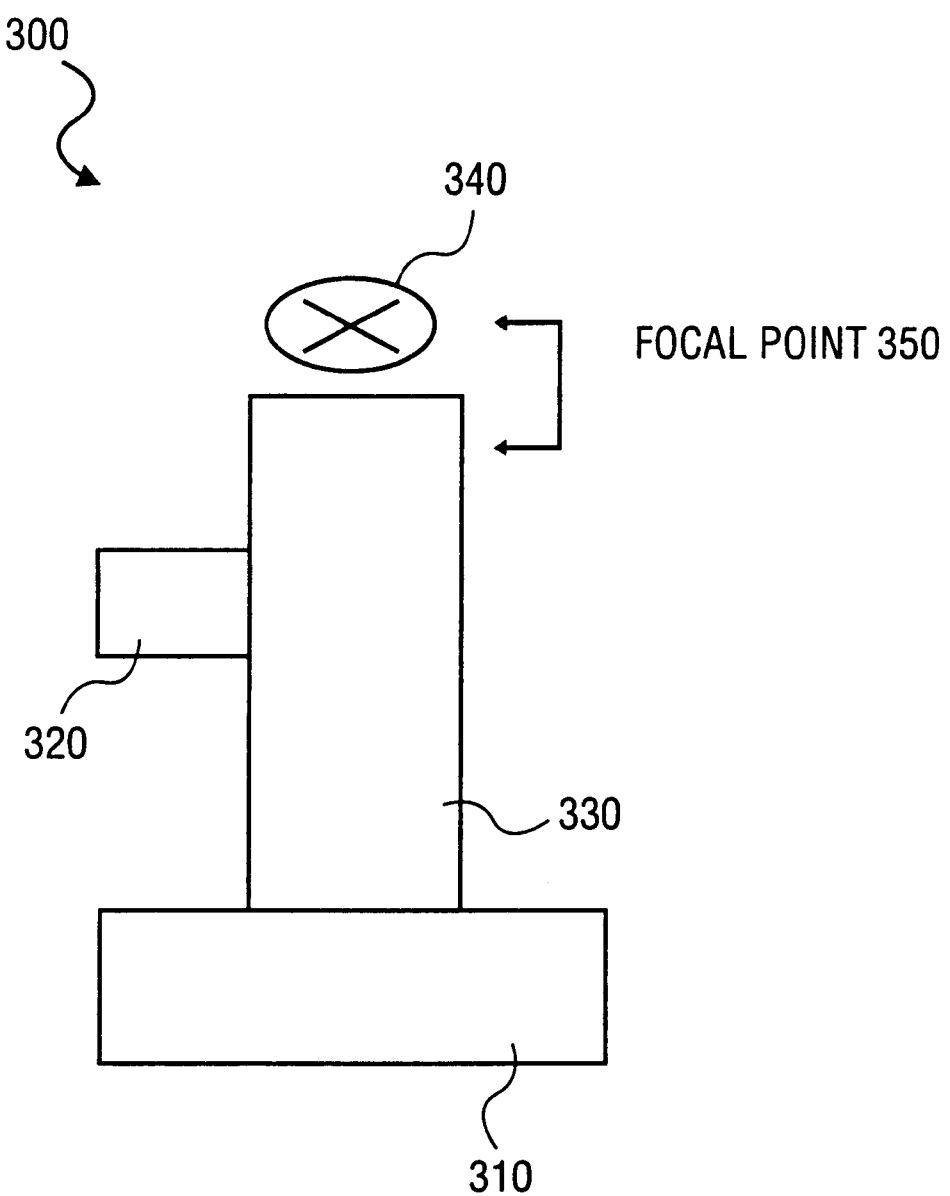
FIG. 3 illustrates one embodiment of a direct probe sensor camera generating a calibration image.

FIG. 3 illustrates one embodiment of a DPS camera generating a calibration image. In particular, system 300 includes an objective (330) coupled to both an image generator (320) and a CCD (310). For one embodiment, system 300 is a video microscope with a fixed field of view. For an alternative embodiment, system 300 generates a calibration image (340) at the focal point (350) of the video microscope.

For one embodiment, system 300 is included in system 200. Accordingly, section 206 of DPS camera 206–210 corresponds to objective 330. Similarly, sections 208 and 210 of DPS camera 206–210 correspond to image generator 320 and CCD 310, respectively.

As illustrated in FIG. 3, image 340 is cross-hair pattern located directly above objective 330. Accordingly, CCD 310 generates a pixel representation of the cross-hair pattern. For one embodiment, the image recorded by CCD 310 is correlated to a fixed camera recording of image 340, thus resulting in the calibration of system 300 and the fixed camera. For another embodiment, system 300 generates a calibration image by illuminating either all or a subset of all the pixels included in CCD 310. The illuminated pixels are subsequently recorded by a fixed camera. Accordingly, each pixel detected by the fixed camera is correlated to each pixel recorded by CCD 310, thus calibrating the fixed camera and system 300.

Figure 4:
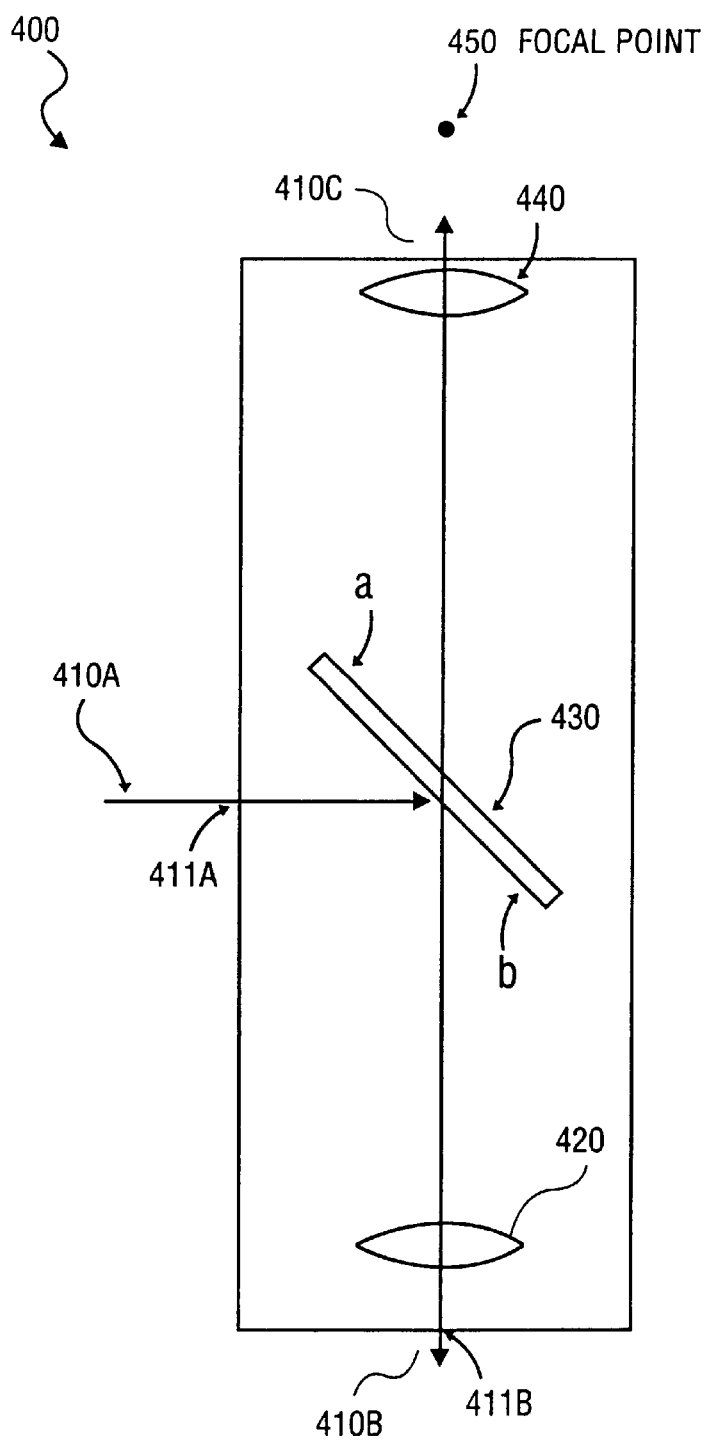
FIG. 4 illustrates one embodiment of an objective included in the direct probe sensor camera of FIG. 3.

FIG. 4 illustrates one embodiment of an objective included in the DPS camera of FIG. 3. In particular, objective 400 includes a rear image forming lens (420), a beam-splitter (430), and an objective lens (440). Objective 400 also includes three illumination paths (410a–c). Illumination path 410b and 410c are the normal optical path through which objective 400 views images.

For one embodiment, beam-splitter 430 is a partially reflecting mirror with an anti-reflective coat on side 'A' and a plane of glass coated for 4–6% refection on side 'B.' For alternative embodiments, the reflective qualities of the glass coat is varied based on the light generated from path 410b. The dual qualities of beam-splitter 430 allow the beam splitter to either deflect light from path 410a to 410b or to effectively transmit light in a bi-directional fashion between path 410c and path 410b. It will be appreciated by one skilled in the art, that the reflective qualities of beam-splitter 430, the displacement of the lenses (420 and 440), and the magnification strength of the lenses (420 and 440) may be varied depending on the focal point and illumination characteristics of the video microscope that houses objective 400.

For one embodiment, objective 400 is used in DPS camera 206–210 of system 200. Accordingly, objective 400 is coupled to image generator 208 CCD 210 at nodes 411a and 411b, respectively. System 200 controls the light'source generated along illumination paths 410a–c to perform two functions, probe-to-pad alignment and calibration. In particular, during probe-to-pad alignment, system 200 turns image generator 208 off. Thus, only ambient light source information (including images of probe pins 232) is transmitted from path 410c to path 410b. Subsequently, the ambient light source information is recorded by CCD 210. In particular, it will be appreciated by one skilled in the art that the arrangement of system 200 does not interfere with the use or placement of other illumination sources, such as coaxial or oblique illumination, that are normally associated with normal image generation in optical systems.

To perform the calibration function, system 200 turns image generator 208 on, thus generating a light source that includes a calibration image along path 410a. Beam-splitter 430 deflects the light source transmitted on path 410a and injects the calibration image into the normal path of light in objective 400, path 410b. In particular, beam-splitter 430 and lens 420 create an image along path 410b that mimics an actual image placed at the focal point (450) of objective 400. CCD 210 records the calibration image transmitted along path 410a and 410b.

For one embodiment, CCD 210 is a reflective CCD. Accordingly, the light source transmitted along path 410b is reflected through lens 420, through beam-splitter 430, and lens 440 onto focal point 450. As previously described, the light source transmitted along path 410b includes a calibration image. Thus, a virtual calibration image is generated at focal point 450. In the present embodiment, system 200 uses the virtual calibration image to calibrate DPS camera 206–210 with fixed camera 220. In particular, system 200 correlates the pixel image recorded by CCD 210 to a recording of the virtual pixel image generated by fixed camera 220, thus determining the orientation and focal point of CCD 210 relative to fixed camera 220. System 200 also uses the predetermined location of both the virtual calibration image and the fixed camera 220 to correlate the field of view between DPS camera 206–210 and fixed camera 220. Additionally, system 200 uses the predetermined location of both the virtual calibration image and fixed camera 220 to calibrate the initial X, Y, and Z coordinates of DPS camera 206–210 relative to fixed camera 220. Based on the aforementioned calibration, system 200 ensures proper probe-to-pad alignment.

Figure 5A:
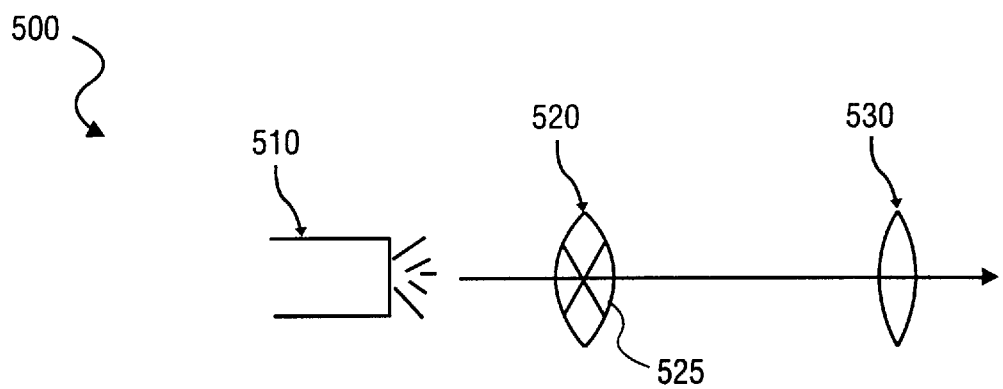
FIG. 5a illustrates one embodiment of an image generator included in the direct probe sensor camera of FIG. 3.

FIG. 5*a* illustrates one embodiment of an image generator included in the direct probe sensor camera of FIG. 3. In particular, image generator 500 includes an illumination source (510), a reticle (520) and a reticle lens (530). Reticle 520 is a flat circular glass plate with a metal deposit applied to the surface of the glass plate. For one embodiment, with the exception of the surface area delineated by cross-hair pattern 525, the metal deposit is uniformly applied to the entire glass surface. The space in the metal deposit allows the light from illumination source 510 to generate a cross-hair light pattern (i.e. a calibration image) that is focused through reticle lens 530. For alternative embodiments, the metal deposit on reticle 520 is varied to generate different calibration images. It will be appreciated by one skilled in the art, that the brightness of illumination source 510, the characteristics of reticle 520 (including but not limited to thickness and impurity content), and the magnification strength of lens 530 may be varied depending on the desired dimensions and brightness of the calibration image.

For one embodiment, image generator 500 is used in conjunction with objective 400 and a reflective CCD. In particular, image generator 500 is coupled to node 411*a* and the reflective CCD is coupled to node 411*b*. Accordingly, the calibration image generated by image generator 500 is transmitted along illumination path 410*a* as a light source. Beam-splitter 430 deflects the light source transmitted on path 410*a* and injects the calibration image into the normal path of light in objective 400, path 410*b*. In particular, beam-splitter 430 and lens 420 create an image along path 410*b* that mimics an actual calibration image placed at focal point 450. The reflective CCD records the calibration image. The reflective CCD also reflects the light source transmitted along path 410*b* back through lens 420, beam-splitter 430, and lens 440 onto focal point 450 as a virtual calibration image. As previously described, the virtual calibration image is used to calibrate a DPS camera housing objective 400 to a fixed camera.

For an alternative embodiment, reticle 520 is removed from system 500. Accordingly, the virtual calibration image is either all or a subset of all the pixels illuminated in the reflective CCD. The illuminated pixels are subsequently recorded by a fixed camera. Thus, each pixel detected by the fixed camera is correlated to each pixel recorded by a DPS camera that houses objective 400. The correlation results in the calibration of the fixed camera and the DPS camera that houses objective 400.

Figure 5B:
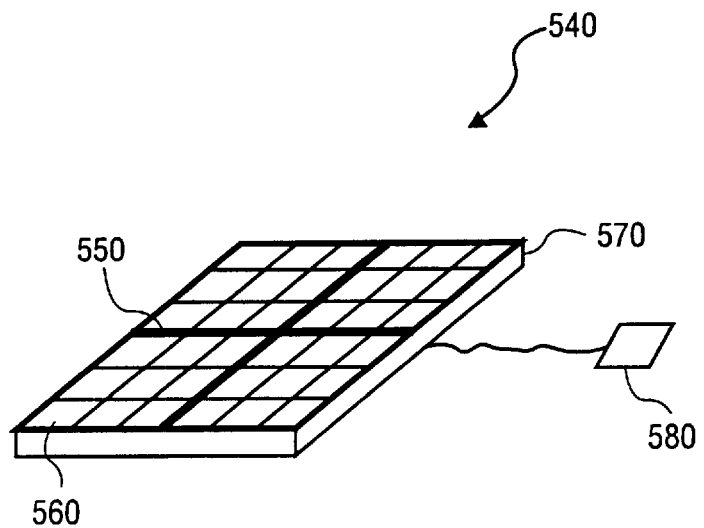
FIG. 5b illustrates one embodiment of a charge coupled device included in the direct probe sensor camera of FIG. 3.

FIG. 5*b* illustrates one embodiment of a charge coupled device included in the direct probe sensor camera of FIG. 3. In particular, CCD 540 includes an array of light sensitive transistor diodes (560), also referred to as cells, that are deposited on a wafer (570). Each cell is addressable through a control circuitry (580) that supplies power to CCD 450. For one embodiment, control circuitry 580 activates all the cells in CCD 540 for a twenty mill-second period. During the twenty milliseconds, each cell accumulates charge depending on the amount and intensity of photons striking the particular cell. For one embodiment, control circuitry 580 generate a pixel representation of the light source striking CCD 540 based on the cells with accumulated charge. For alternative embodiments, control circuitry 580 activates all the cells in CCD 540 for different time periods depending on the photon absorption qualities of the specific CCD.

In the present embodiment, CCD 540 is used in conjunction with objective 400 and image generator 500. In particular, image generator 500 is coupled to node 411*a* and CCD 540 is coupled to node 411*b*. Accordingly, the calibration image generated by image generator 500 is transmitted along illumination path 410*a* as a light source. Beam-splitter 430 deflects the light source transmitted on path 410*a* and injects the calibration image into the normal path of light in objective 400, path 410*b*. In particular, beam-splitter 430 and lens 420 create an image along path 410*b* that mimics an actual calibration image placed at focal point 450.

FIG. 5*b* illustrates the charge accumulation of CCD 540 as photons from the light source along path 410*b* strike the surface of CCD 540. In particular, the cells delineated by cross-hair 550 are struck by the light source created by image generator 500. CCD 540 records the cells with accumulated charge via control circuitry 580, thus generating a pixel representation of the light source striking CCD 540.

Following the previous example, for an alternative embodiment, CCD 540 is a reflective CCD. Accordingly, the cells struck by the light source transmitted along path 410*b* reflects the light source back through lens 420, beam-splitter 430, and lens 440 onto focal point 450 as a virtual calibration image. As previously described, the virtual calibration image is used to calibrate a DPS camera housing objective 400 to a fixed camera. For one embodiment, the cells of CCD 540 reflect ten to thirty percent of the photons absorbed by the illuminated cells. For alternative embodiments, the reflective qualities of beam-splitter 430, the displacement of the lenses (420 and 440), and the magnification strength of the lenses (420 and 440) may be varied depending on the reflective characteristics of CCD 540.

Thus, an apparatus and method for projecting an alignment image have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A testing system operable to accurately position a plurality of contact electrodes relative to a plurality of electrical contacts, the testing system comprising:

a first imaging system coupled to a first component, the first component configured to hold a device coupled to the plurality of electrical contacts, wherein the first imaging system is configured to locate the plurality of contact electrodes;

a second imaging system coupled to a second component, wherein the second imaging system is configured to locate the plurality of electrical contacts of the device; and image generator coupled to at least one of the first imaging system, the first component, or the second component, wherein the image generator is configured to generate an alignment image in an optical path of the second imaging system, the testing system calibrating the first imaging system to the second imaging system using the alignment image, wherein the second imaging system comprises:
a charge coupled device which is configured to reflect the alignment image onto the first imaging system and wherein the charge coupled device records the alignment image for use in aligning the first imaging system with the second imaging system.

2. The testing system of claim 1, wherein the electrical contacts comprise pads.

3. The testing system of claim 1, wherein the electrical contacts comprise probe pins.

4. The testing system of claim 1, wherein the electrical contacts comprise electrodes.

5. The testing system of claim 1, wherein the testing system is configured to calibrate the first imaging system to the second imaging system by correlating the first imaging system recording of the alignment image to the second imaging system recording of the alignment image.

6. The testing system of claim 5, the second imaging system having a predetermined field of view, the testing system using the predetermined field of view of the second imaging system to calibrate the first imaging system to the second imaging system.

7. The testing system of claim 5, the second component having a fixed position, the testing system using the fixed position of the second component to calibrate the first imaging system to the second imaging system.

8. The testing system of claim 1, wherein the second imaging system comprises a video microscope having an objective lens, a rear forming lens, and a beam-splitter coupled between the objective lens and the rear forming lens.

9. The testing system of claim 8, wherein the video microscope comprises a further charge coupled device, and wherein the further charge coupled device records the alignment image.

10. The testing system of claim 1, wherein the first imaging system comprises a further charge coupled device, and wherein the further charge coupled device is configured to record the alignment image.

11. The testing system of claim 1, wherein the first component comprises a wafer chuck.

12. The testing system of claim 11, wherein the device comprises a wafer.

13. The testing system of claim 12, wherein the first imagining system comprises a direct probe sense camera.

14. The testing system of claim 13, wherein the second imagining system comprises a wafer sort camera.

15. A method for accurately positioning a plurality of contact electrodes relative to a plurality of electrical contacts, the method comprising:
generating an alignment image at a focal point of a first imagining system;
recording the alignment image through the first imaging system;
moving the alignment image to a second imaging system;
recording the alignment image through the second imaging system, wherein the field of view of the second imaging system is determined; and
calibrating the first imaging system to the second imaging system, wherein the calibration is performed by correlating the alignment recording of the first imaging system to the alignment recording of the second imaging system, wherein the second imaging'system comprises:
a charge coupled device which is configured to reflect the alignment image onto the first imaging system and wherein the charge coupled device records the alignment image for use in aligning the first imaging system with the second imaging system.

16. The method of claim 15, wherein the calibration is performed by tracking the movement of the alignment image relative to the second imaging system and wherein the alignment image is generated by optically projecting an image of the alignment image.

17. The method of claim 15, wherein the electrical contacts comprise pads.

18. The method of claim 15, wherein the electrical contacts comprise probe pins.

19. The method of claim 15, wherein the electrical contacts comprise electrodes.

20. A testing system operable to accurately position a plurality of contact electrodes relative to a plurality of electrical contacts, the testing system comprising:
a first imaging system coupled to a first component, the first component configured to hold the plurality of electrical contacts, wherein the first imaging system is configured to locate the plurality of contact electrodes;
a second imaging system coupled to a second component, wherein the second imaging system is configured to locate the plurality of electrical contacts; and
an image generator coupled to at least one of the first imaging system, the first component, or the second component, wherein the image generator is configured to generate an alignment image in an optical path of one of the first or second imaging system, the testing system calibrating the first imaging system to the second imaging system using the alignment image, wherein at least one of the first imaging system or the second imaging system comprises:
a camera device which is configured to reflect the alignment image onto the other of the first imaging system or the second imaging system and wherein the camera device records the alignment image for use in aligning the first imaging system with the second imaging system.

21. The testing system of claim 20, wherein the electrical contacts comprise pads.

22. The testing system of claim 20, wherein the electrical contacts comprise probe pins.

23. The testing system of claim 20, wherein the electrical contacts comprise electrodes.

24. The testing system of claim 20, wherein the testing system is configured to calibrate the first imaging system to the second imaging system by correlating the first imaging system recording of the alignment image to the second imaging system recording of the alignment image.

25. The testing system of claim 24, the second imaging system having a predetermined field of view, the testing system using the predetermined field of view of the second imaging system to calibrate the first imaging system to the second imaging system.

26. The testing system of claim 24, the second component having a fixed position, the testing system using the fixed position of the second component to calibrate the first imaging system to the second imaging system.

27. The testing system of claim 20, wherein the second imaging system comprises a video microscope having an objective lens, a rear forming lens, and a beam-splitter coupled between the objective lens and the rear forming lens.

28. The testing system of claim 27, wherein the video microscope comprises a charge coupled device, and wherein the charge coupled device records the alignment image.

29. The testing system of claim 20, wherein the first imaging system comprises a charge coupled device, and wherein the charge coupled device is configured to record the alignment image.

30. The testing system of claim 20, wherein the first component comprises a wafer chuck.

31. The testing system of claim 30, wherein the first imaging system comprises a direct probe sense camera.

32. The testing system of claim 31, wherein the second imagining system comprises a wafer sort camera.

* * * * *